(12) United States Patent
Harazono

(10) Patent No.: US 7,029,186 B2
(45) Date of Patent: Apr. 18, 2006

(54) SOLID-STATE IMAGING APPARATUS AND MANUFACTURING METHOD THEREOF

(75) Inventor: Fumikazu Harazono, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 390 days.

(21) Appl. No.: 10/307,174

(22) Filed: Nov. 29, 2002

(65) Prior Publication Data

US 2003/0112714 A1 Jun. 19, 2003

(30) Foreign Application Priority Data

Nov. 30, 2001 (JP) ............................. 2001-366982

(51) Int. Cl.
*G02B 6/36* (2006.01)
(52) U.S. Cl. ........................ 385/93; 385/92; 257/434; 257/680; 438/116
(58) Field of Classification Search ........ 257/431–434, 257/680, 687, 701, 704, 710; 361/736, 737; 348/340; 438/106, 116; 385/92, 93
See application file for complete search history.

(56) References Cited

U.S. PATENT DOCUMENTS

| | | | | |
|---|---|---|---|---|
| 5,087,964 A | * | 2/1992 | Hatta ........................... | 257/680 |
| 5,153,734 A | * | 10/1992 | Kanamori et al. ........... | 348/340 |
| 5,264,393 A | * | 11/1993 | Tamura et al. ................ | 438/64 |
| 5,821,532 A | * | 10/1998 | Beaman et al. .............. | 250/239 |
| 6,072,232 A | * | 6/2000 | Li et al. ....................... | 257/680 |
| 6,313,525 B1 | * | 11/2001 | Sasano ......................... | 257/704 |
| 6,384,473 B1 | * | 5/2002 | Peterson et al. ............. | 257/680 |
| 6,518,656 B1 | * | 2/2003 | Nakayama et al. ........... | 257/680 |
| 6,531,334 B1 | * | 3/2003 | Sasano ......................... | 438/64 |
| 6,740,949 B1 | * | 5/2004 | Andoh et al. ................ | 257/432 |

FOREIGN PATENT DOCUMENTS

JP 2001-245186 9/2001

\* cited by examiner

*Primary Examiner*—Akm Enayet Ullah
*Assistant Examiner*—Daniel Petkovsek
(74) *Attorney, Agent, or Firm*—Pearne & Gordon LLP

(57) ABSTRACT

A light-transmitting member is previously formed, and then integrally molded during a process of molding a structure member. A solid-state imaging apparatus has: the structure member configured by an insulating resin and having a through-opening portion; a wiring portion which is formed on the surface of the structure member; a solid-state image pickup element connected to the wiring portion and attached to the through-opening portion; and a light-transmitting member which is placed to cover the through-opening portion with being separated from the solid-state imaging element by a predetermined distance The light-transmitting member is configured by a plate-like member made of a material which is smaller in coefficient of linear expansion than the insulating resin, and integrally molded with the structure member to be embedded at a peripheral portion into the structure member.

8 Claims, 6 Drawing Sheets

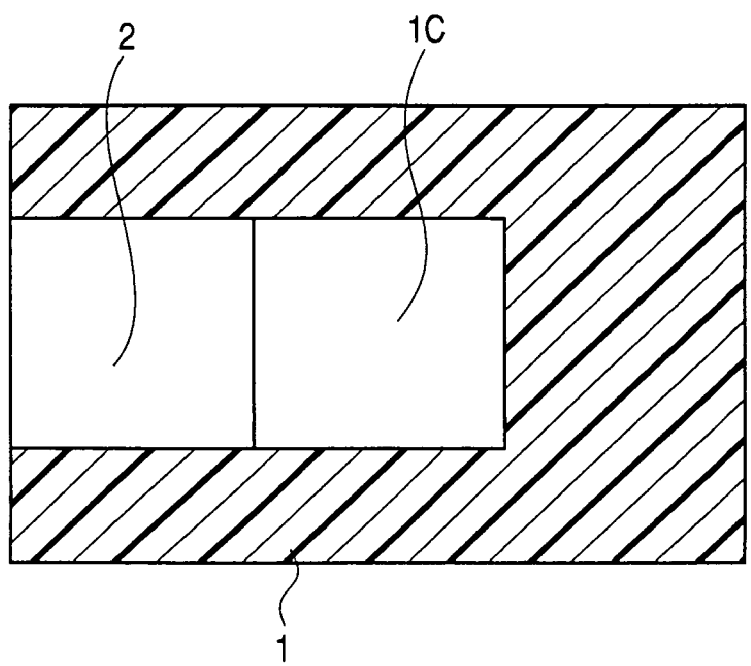
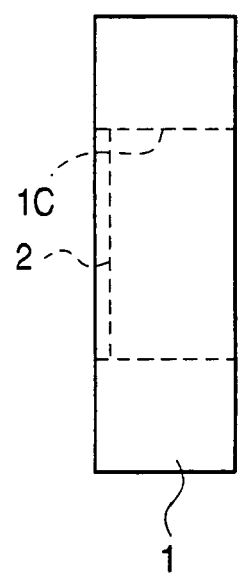
FIG. 3A
FIG. 3B

SOLID-STATE IMAGING APPARATUS AND MANUFACTURING METHOD THEREOF

BACKGROUND OF THE INVENTION

The present invention relates to a solid-state imaging apparatus and a manufacturing method thereof, and more particularly to a small-sized solid-state imaging apparatus including a solid-state image pickup element, such as a surveillance camera, a medical camera, or a vehicle camera, and a manufacturing method thereof.

An imaging apparatus of this kind receives an image through an optical system such as a lens, and outputs the image in the form of an electric signal. Recently, in accordance with miniaturization and enhancement of the performance of such an imaging apparatus, also the size of a camera is reduced, and an imaging apparatus is used in various fields and expands its market as an image inputting device.

In a conventional imaging apparatus using a solid-state image pickup element, each of components such as a lens, the solid-state image pickup element, and an LSI on which a driving circuit for the element and a signal processing circuit are mounted, has a shape of a case or a structure member, and the components are combined with each other. Conventionally, a mounting structure based on such a combination is formed by mounting elements onto a flat printed circuit board.

In order to further miniaturize such a device, a three-dimensional printed circuit board 101 shown in FIG. 7 was proposed in Japanese Patent Publication No 2001-245186. The printed circuit board 101 is made of a resin in which a mounting member is configured by a leg portion 101A having a rectangular table-like shape, and a body portion 101B formed on the leg portion, and a through-opening portion 101C is formed in the interface between the leg portion 101A and the body portion 101B. A printed wiring pattern 105 is formed on the three-dimensional printed circuit board on side of the rear face of the leg portion 101A. A lens is fitted into the inner periphery of the body portion 101B. While being centered at the optical axis 117 of the lens, an optical filter 103 is placed above the through-opening portion 101C, and a solid-state image pickup element 104 and chip components 108 are placed below the through-opening portion. As shown in a section view of FIG. 8, the printed circuit board is connected by using solder 114 through the printed wiring pattern 105 formed on the leg portion 101A, to a main board 113 of an apparatus such as a portable telephone or a personal computer. FIG. 9 is a view showing main portions of the connections. The solid-state image pickup element 104 is connected to the printed wiring pattern 105 formed on the leg portion 101A, through bumps 106 formed on the surface of the image pickup element 104, and then sealed by a sealing resin 107 to accomplish the connections with the three-dimensional printed circuit board 101.

The identical portions are denoted by the identical reference numerals.

In the mounting process, as shown in FIGS. 10A to 10C, a method is employed in which, after the three-dimensional printed circuitboard 101 is molded (FIG. 10A), the solid-state image pickup element 104 is attached to the board (FIG. 10B), and the optical filter 103 is then attached (FIG. 10C).

In a heating step in the process of mounting the solid-state image pickup element 104 onto the three-dimensional printed circuit board 101, the three-dimensional printed circuit board 101 is largely deformed, and a very high stress is generated in connecting portions between the solid-state image pickup element 104 and the three-dimensional printed circuit board 101, so that a connection failure due to cracking often occurs.

Usually, such a three-dimensional printed circuit board is obtained by injection molding, However, there is a problem in that fillers, which are often used in order to reduce the coefficient of expansion of a resin material, cannot be added in an amount larger than a given one from the viewpoints of the molding accuracy and the durability of molding dies.

A thermoplastic, resin usually used in injection molding has a straight-chain molecular structure, and hence exhibits anisotropic properties that the coefficient of linear expansion is small, in the molecular bonding direction and large in a direction perpendicular to the bonding direction. In such a resin, fillers are oriented in the molding flow direction to exhibit, further anisotropic properties that the coefficient is large in a direction perpendicular to the molding flow direction.

In a heating step in the process of mounting a solid-state image pickup element onto a three-dimensional printed circuit board, the three-dimensional printed circuit board is largely deformed, and a very high stress is generated in connecting portions between the solid-state image pickup element and the three-dimensional printed circuit board, so that a connection failure due to cracking often occurs.

Usually, such connecting portions between a solid-state image pickup element and a three-dimensional printed circuit board are configured by pads disposed on the solid-state image pickup element, and terminals of the three-dimensional printed circuit board. The connection between them is realized by connection using an electrically conductive adhesive agent such as silver paste, ultrasonic bonding, thermocompression bonding, or the like.

In any of the methods, the adhesion of the solid-state image pickup element is easily broken because of thermal deformation of the three-dimensional printed circuit board, and this causes the production yield to be lowered.

When a printed circuit board is three-dimensionally structured, miniaturization is enabled, but thermal distortion is larger than that in the case of a usual two-dimensional structure, thereby causing a large problem in that deformation due to the difference in coefficient of expansion blocks improvement of the yield.

Usually, the optical filter 103 is made of a quartz refraction plate, or a glass material such as IR (infrared) cut-off coated glass, and is lower in coefficient of thermal expansion and also in thermal deformation than a resin material.

Therefore, it may be contemplated that, when the optical filter 103 is previously attached, thermal deformation during the process of attaching the solid-state image-pickup element is largely improved Actually, however, the process of attaching the solid-state image pickup element must be conducted so that direct bonding is first done through bumps and the vicinity of connecting portions is then sealed by a sealing resin. Consequently, there arise problems in that a gas generated during the sealing step is trapped in the through-opening portion 1C to react with the surface of the solid-state image pickup element as a result of application of heat, and that the generation of the gas rises the internal pressure to deteriorate the solid-state image pickup element or deform the three-dimensional printed circuit board.

For the foregoing reasons, in a conventional structure, a method is employed in which an optical filter is attached after a solid-state image pickup element is attached.

Therefore, the production requires a large number of steps. Also the positioning operation in each attaching step is one of the causes of blocking the improvement of the productivity.

SUMMARY OF THE INVENTION

The invention has been conducted in view of the circumstances. It is an object of the invention to suppress thermal deformation of a structure member such as a three-dimensional printed circuit board, to ensure connection of a solid-state image pickup element and improve the bonding quality of the solid-state image pickup element.

It is another object of the invention to miniaturize the whole device and simplify the manufacturing steps.

In the invention, a light-transmitting member is previously formed, and then integrally molded during a process of molding a structure member, whereby attaching steps are reduced and the structure of an attaching portion is simplified to realize miniaturization of a device.

According to the solid-state imaging apparatus of the invention, the apparatus includes: a structure member which is configured by an insulating resin, and which has a through-opening portion; a wiring portion which is formed on a surface of the structure member; a solid-state image pickup element which is connected to the wiring portion, and which is attached to the structure member to cover the through-opening portion; and a light-transmitting member which is attached to the structure member to cover the through-opening portion with being separated from the solid-state image pickup element by a predetermined distance, and the light-transmitting member is configured by a plate-like,member made of a material which is smaller in coefficient of linear expansion than the insulating resin, and integrally molded with the structure member to be embedded at a peripheral portion into the structure member.

According to the configuration, since the light transmitting member of less thermal deformation is molded integrally with the structure member, thermal deformation of the structure member which occurs during a process of attaching the solid-state image pickup element is greatly reduced, so that connection failures are largely decreased.

Furthermore, a step of attaching the light-transmitting member is not required, and hence the productivity can be improved. Also a margin which is necessary for such attachment is not required, and hence the apparatus can be miniaturized.

Preferably, the structure member includes a penetrated hole communicating with the through-opening portion, the penetrated hole being attached in a region positioned between a solid-state image pickup element mounting portion where the solid-state image pickup element is attached, and a light-transmitting member embedding portion.

According to the configuration, the following effect is attained in addition to the above-mentioned effects. Since the penetrated hole communicating with the through-opening portion is provided in the vicinity of the light-transmitting member of the structure member, a gas generated during the process of attaching the solid-state image pickup element is discharged through the penetrated hole. Therefore, the problems in that a gas generated during the sealing step is trapped in the through-opening portion 1C to react with the; surface of the solid-state image pickup element as a result of application of heat, and that the generation of the gas rises the internal pressure to deteriorate the solid-state image pickup element or deform the three-dimensional printed circuit board can be eliminated.

Preferably, the structure member has a leg portion on which the wiring portion is to be formed, and a cylindrical body portion which is disposed on the leg portion, and the through-opening portion is formed between the body portion and the leg portion.

When this configuration is applied to a conventional apparatus, the whole structure may be miniaturized, but there arises a problem in that a connection failure due to deformation of a connecting portion is easily caused by thermal deformation. In contrast, according to the invention, the solid-state image pickup element can be attached after the light-transmitting member such as an optical filter which is smaller in coefficient of thermal expansion than the insulating resin, and in which less thermal deformation is produced is attached by integral molding. Therefore, thermal deformation of the structure member made of the insulating resin can be suppressed, and the certainty of the connection of the solid-state image pickup element can be enhanced.

Preferably, the light-transmitting member is configured by forming a dielectric thin film of a multilayer structure on a surface of quartz glass.

According to the configuration, since the coefficient of thermal expansion of quartz glass is smaller by one order than that of the resin configuring the structure member, deformation which is produced by heat during a process of mounting the solid-state image-pickup element can be reduced, so that the reliability can be improved.

Preferably, the light-transmitting member is made of a thermosetting resin.

According to the configuration, since a thermosetting resin is used as the light-transmitting member, deformation which is produced by heat during a process of mounting the solid-state image-pickup element can be reduced, so that the reliability can be improved.

Preferably, the light transmitting member is an optical filter.

The position where the optical filter is attached determines the distance between the solid-state image-pickup element and a lens which is attached in an outer position, and hence the attachment position is an important factor. According to the configuration, since the light-transmitting member is fixed by integral molding and configured by a member of a small coefficient of thermal expansion, deformation of the structure member is suppressed in the vicinity of the light-transmitting member. Therefore, thermal deformation of the structure member in the vicinity of the solid-state image-pickup element can be suppressed, so that the certainty of the distance between the solid-state image-pickup element and the optical filter is enhanced to enabling more excellent image capturing.

Further, according to the method of the invention, the method includes: a light-transmitting member forming step of molding a material which is smaller in coefficient of linear expansion than an insulating resin constituting a structure member, into a plate-like member, thereby forming a light-transmitting member; a structure member molding step of placing the light-transmitting member in molding dies, then conducting a molding process by using the insulating resin as a material to form a through-opening portion and a solid-state image pickup element attaching portion to which a solid-state image pickup element can be attached to close the through-opening portion, and integrally mold the light-transmitting member and the structure member to cover the through-opening portion with being separated from the solid-state image-pickup element attaching portion by a predetermined distance and embed a peripheral portion of the light-transmitting member; a wiring board forming step of forming a wiring portion on the structure member; and a solid-state image pickup element attaching step of attaching the solid-state image pickup element to the solid-state image pickup element attaching portion.

According to the configuration, since the light-transmitting member of less thermal deformation is molded integrally with the structure member, thermal deformation of the structure member which occurs during a process of attaching the solid-state image pickup element is greatly reduced, so that connection failures are largely decreased A step of attaching the light-transmitting member is not required, and hence the productivity can be improved. Also a margin which is necessary for such attachment is not required, and hence the apparatus can be miniaturized.

Preferably, the structure member molding step is an injection molding step of forming the structure member made of a thermoplastic insulating resin by injection molding.

When such a structure member is made of a thermoplastic resin and formed by injection molding, deformation is easily produced particularly during a hardening process, and deformation is produced also when a apparatus is used in a high temperature environment, thereby causing a problem in that a connection failure easily occurs in, a portion where the solid-state image pickup element is connected to the structure member (three-dimensional printed circuit board) In contrast, according to the configuration, the light-transmitting member such as optical filter is molded integrally with the structure member, and hence thermal deformation of the structure member made of the insulating resin is suppressed by the light-transmitting member made of a glass plate or the like in which the coefficient of thermal expansion is smaller than that of the insulating resin, so that the certainty of the connection of the solid-state image pickup element can be enhanced.

Preferably, the method further includes a step of forming a penetrated hole in the structure member to face the through-opening portion.

According, to the configuration, since the structure member has the penetrated hole communicating with the through-opening portion and the solid-state image pickup element is attached after the light-transmitting member such as an optical filter is attached, an internal gas generated during the process of attaching the solid-state image pickup element is discharged through the penetrated hole. Therefore, the problems in that a gas generated during the sealing step is trapped in the through-opening portion 1C to react with the surface of the solid-state image pickup element as a result of application of heat, and that the generation of the gas rises the internal pressure to deteriorate the solid-state image pickup element or deform the structure member can be eliminated, and sure connection is enabled. Because of the presence of the light-transmitting member of less thermal deformation, thermal deformation of the structure member which occurs during a process of attaching the solid-state image-pickup element is greatly reduced, so that connection failures are largely decreased.

Preferably, the penetrated hole is formed at each of positions where the penetrated holes face each other across the through-opening portion in a direction perpendicular to an injection direction of the thermoplastic resin.

A thermoplastic resin which is used in injection molding has a straight-chain molecular structure, and hence exhibits anisotropic properties that the coefficient of thermal expansion is small in the molecular bonding direction and large in a direction perpendicular to the bonding direction. According to the configuration, since the penetrated holes are formed respectively at positions where the penetrated holes face each other across the through-opening portion in a direction perpendicular to the injection direction of the thermoplastic resin, it is possible to suppress the elongation in a direction perpendicular to the molecular bonding direction.

A penetrated hole may be previously formed in a portion of the light-transmitting member which will function as a region facing the, through-opening portion, and the hole may be used as a hole for discharging a gas.

BRIEF DESCRIPTION OF THE DRAWINGS

FIGS. 3A and 3B are views showing another example of the optical filter attaching portion in the first embodiment of the invention;

DETAILED DESCRIPTION OF THE PREFERRED EMBODIMENT

Hereinafter, embodiments of the invention will be described in detail with reference to the accompanying drawings.

(Embodiment 1)

Figure 1:
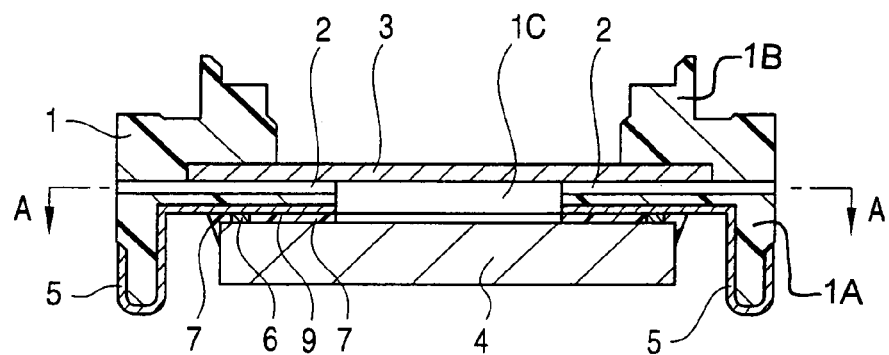
FIG. 1 is a section view showing a solid-state imaging apparatus of a first embodiment of the invention.

FIG. 1 is a view showing main portions of a solid-state imaging apparatus according to a first embodiment of the invention.

In the solid-state imaging apparatus, in a molding process of a structure member 1 on which a solid-state image pickup element 4 is to be mounted, a plate-like member constituting an optical filter 3 is integrally molded to the structure member 1, and penetrated holes 2 communicating with a through-opening portion 1C are formed so that an internal gas generated during a process of mounting a solid-state image pickup element onto a solid-state image pickup element attaching portion 9 of the structure member 1 can be discharged. In the embodiment, the optical filter 3 is configured by a quartz refraction plate for example, and fixed in a state where a peripheral portion of the filter is embedded into the structure member The solid-state imaging apparatus has the structure member 1 and the solid-state image pickup element 4. The structure member is made of an insulating polyphthalamide resin and configured by a leg portion 1A having a rectangular table-like shape, and a body portion 1B formed on the leg portion, and having the through-opening portion 1C formed in the interface between the leg portion 1A and the body portion 1B. In order to allow an internal gas to be discharged, the structure member has penetrated holes 2 communicating with the through-opening portion 1C. The structure member 1 further includes a wiring portion having a terminal pattern 5 in a part of the surface. The solid-state image pickup element 4 is connected to the wiring portion, attached to the through-opening portion 1C, and electrically connected to the terminal pattern 5.

Figure 2A:
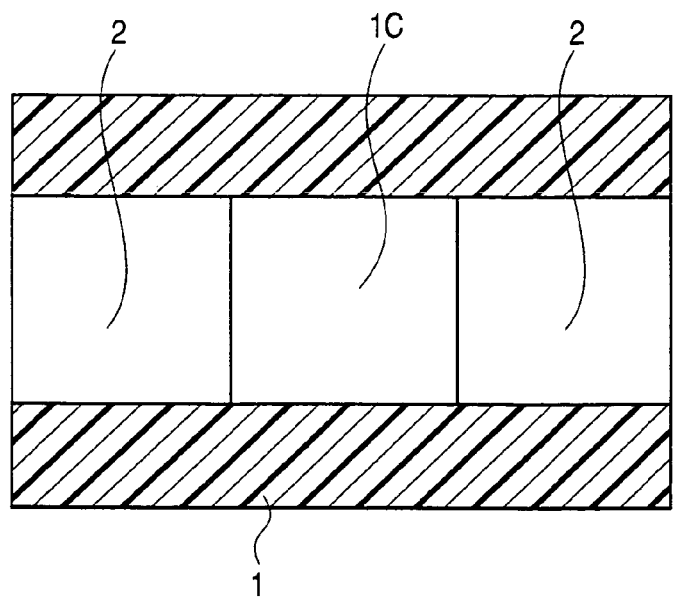
FIGS. 2A and 2B are views showing an optical filter attaching portion in the first embodiment of the invention.
Figure 2B:
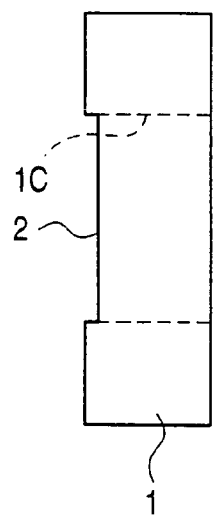

According to the embodiment, as shown in FIGS. 2A and 2B which are respectively a section view taken along the line A—A in FIG. 1, and a side view, the penetrated holes 2 are formed respectively at positions where the penetrated holes face each other across the through-opening portion 1C in a direction perpendicular to the injection direction of the thermoplastic resin.

As described above, a thermoplastic resin usually used in injection molding has a straight-chain molecular structure, and hence exhibits anisotropic properties that the coefficient of thermal expansion is small in the molecular bonding direction and large in a direction perpendicular to the bonding direction. Therefore, the penetrated holes 2 are formed respectively at positions where the penetrated holes face each other across the through-opening portion 1C in a direction perpendicular to the injection direction of the thermoplastic resin, whereby the elongation in a direction perpendicular to the molecular bonding direction can be suppressed.

Next, a method of manufacturing the solid-state imaging apparatus will be described.

Figure 4A:
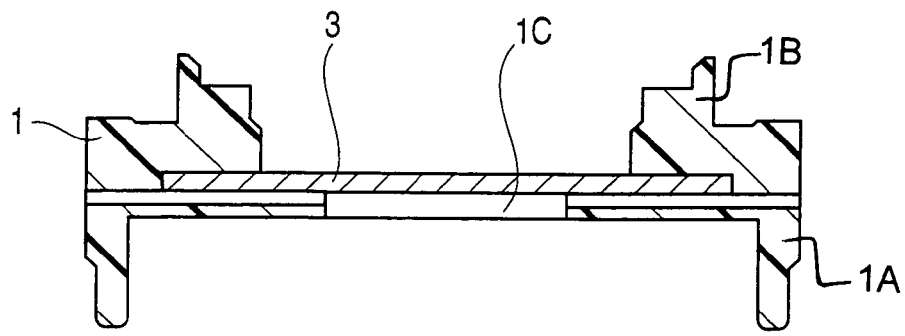
FIGS. 4A to 4C are views showing steps of mounting the solid state imaging apparatus of the first embodiment of the invention.

First, as shown in FIG. 4A, a dielectric thin film of a multilayer structure having a desired refractive index is vapor-deposited onto the surface of a quartz plate to form the optical filter 3 configured by a dielectric interference filter. The optical filter 3 is placed in molding dies. A polyphthalamide resin is injected into a cavity formed in the molding dies, and then cooled and cured, thereby forming the structure member 1 made of a polyphthalamide resin, configured by the leg portion 1A which has a rectangular table-like shape, and the body portion 1B which is formed on the leg portion, and having the penetrated holes 2 communicating with the through-opening portion 1C. The optical filter 3 is integrally formed so as to cover one face of the through-opening portion 1C with leaving the penetrated holes 2.

Figure 4B:
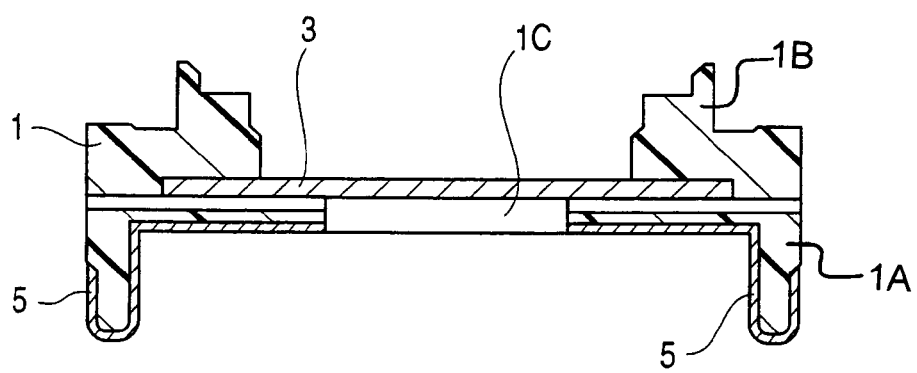

As shown in FIG. 4B, then, the wiring portion including the terminal pattern 5 formed on the rear face of the leg portion 1A is formed in a predetermined area of the structure member by a plating process or a thin film process such as the sputtering technique.

Figure 4C:
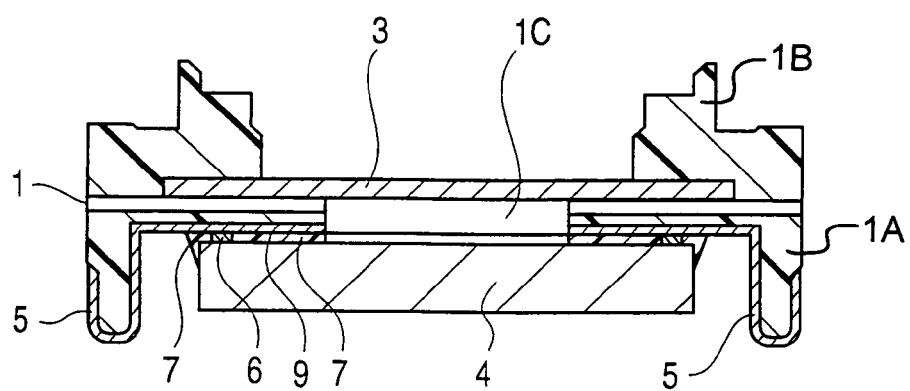

As shown in FIG. 4C, thereafter, the solid-state image pickup element (chip) 4 is mounted onto one face of the through-opening portion 1C of the structure member 1. Bumps 6 are previously formed on contact terminals of the solid-state image pickup element 4, and the terminals are connected by thermocompression bonding to ends of the terminal patterns formed on the leg portion 1A of the structure member 1. Then, a resin sealing process is conducted to cover the surface of the solid-state, image pickup element 4 by a resin sealing member 7.

In the thus formed solid-state imaging apparatus, the solid-state image pickup element 4 is attached to the structure member with which the optical filter 3 of less thermal deformation and having a coefficient of thermal expansion that is smaller than that of the structure member is integrally molded. Therefore, the optical filter 3 functions as a fixing member to suppress thermal deformation of the structure member, with the result that the certainty of the connection of the solid-state image pickup element 4 can be enhanced.

The structure member is obtained by injection molding. A polyphthalamide resin has a straight-chain molecular structure, and hence exhibits anisotropic properties that the coefficient of thermal expansion is small in the molecular bonding direction and large in a direction perpendicular to the bonding direction. In the first embodiment, therefore, the penetrated holes 2 are formed respectively at positions where the penetrated holes face each other across the through-opening portion 1C in a direction perpendicular to the injection direction of the thermoplastic resin, so that it is possible to suppress the elongation in a direction perpendicular to the molecular bonding direction.

In the first embodiment, as shown in FIG. 2A, the two penetrated holes 2 are formed at positions where the penetrated holes face each other across the through-opening portion 1C. Alternatively, as shown in FIG. 3A, the penetrated hole 2 may be formed only on one side.

In the first embodiment, the penetrated holes 2 are formed in the vicinity of the optical fiber embedding portion. The penetrated hole may be adequately modified and have any shape as far as it is opened in the through-opening portion 1C.

(Embodiment 2)

Figure 5:
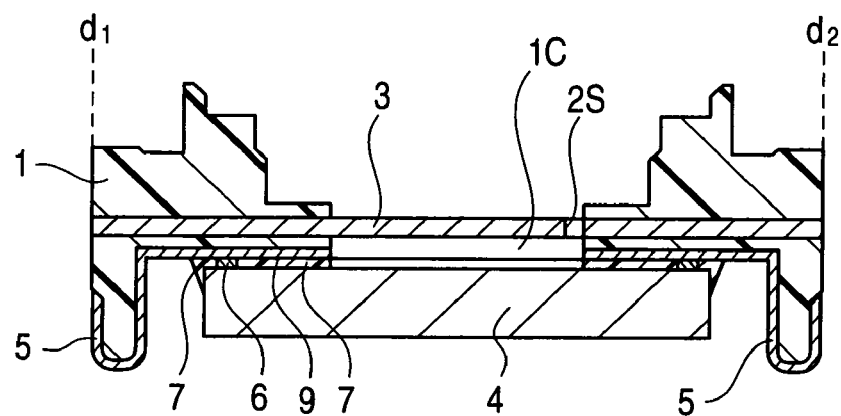
FIG. 5 is a section view showing a solid-state imaging apparatus of a second embodiment of the invention.

FIG. 5 is a view showing main portions of a solid-state imaging apparatus according to a second embodiment of the invention.

According to the embodiment, in the molding process of the structure member 1 on which the solid-state image pickup element 4 is to be mounted, a plate-like member in which many optical filters 3 are integrally formed is formed, and many structure members 1 are integrally molded together with the plate-like member, so that the molded product can be then diced into individual solid-state imaging apparatuses.

Further, according to the embodiment, in order to discharge an internal gas generated during the process of mounting the solid-state image pickup element 4, a penetrated hole 2S communicating with the through-opening portion 1C is formed in the optical filter 3. In the embodiment, the optical filter is configured by a quartz refraction plate, and fixed in a state where a peripheral portion of the filter is embedded into the structure member 1. The other portions are formed in the same manner as those of the first embodiment.

Figure 6:
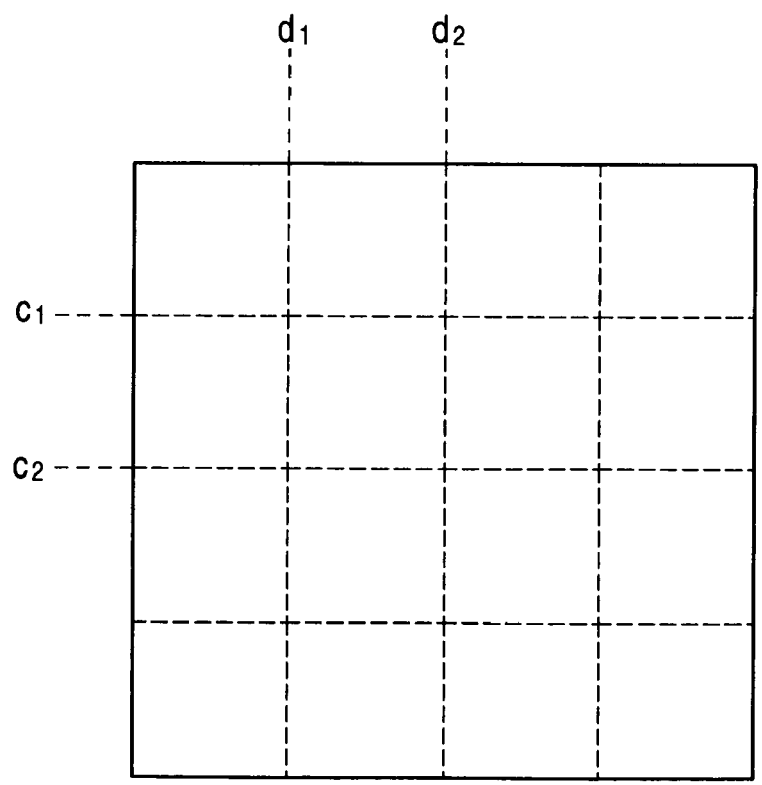
FIG. 6 is a view showing a step of mounting the solid-state imaging apparatus of the second embodiment of the invention.
Figure 7:
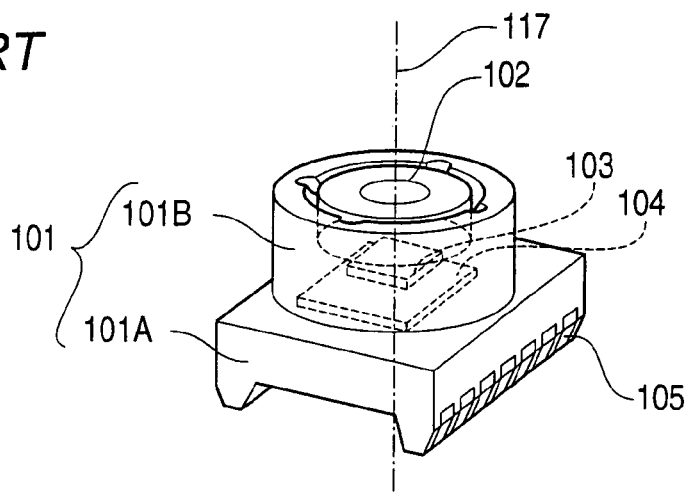
FIG. 7 is a perspective view showing a conventional solid-state imaging apparatus.
Figure 8:
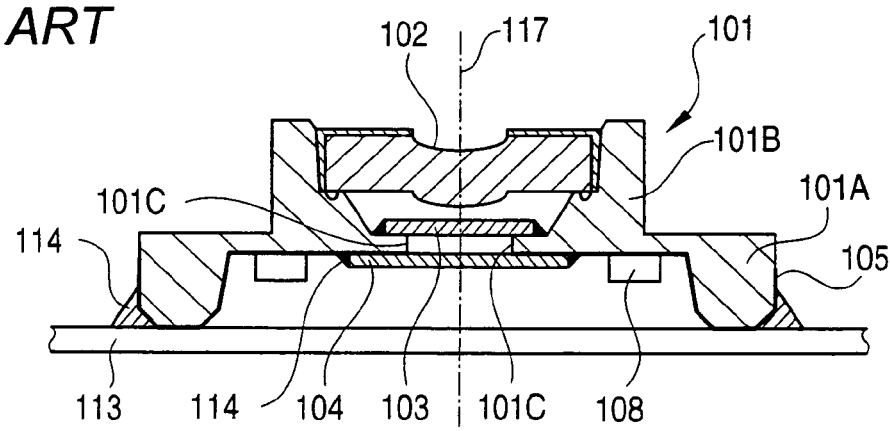
FIG. 8 is a section view showing the conventional solid-state imaging apparatus.
Figure 9:
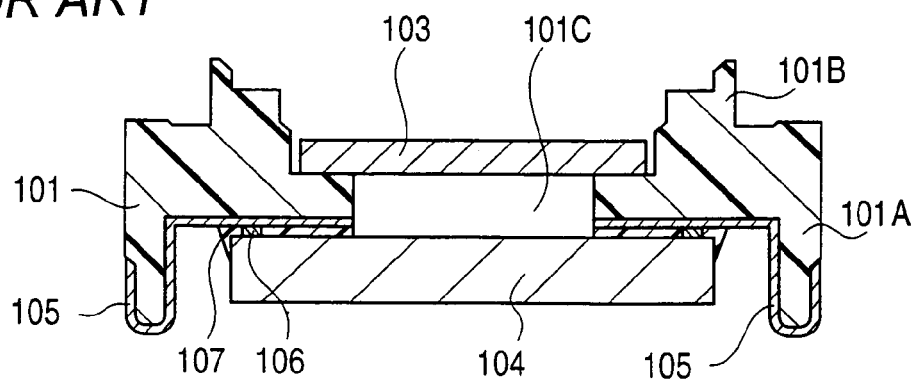
FIG. 9 is a view showing main portions of the conventional solid-state imaging apparatus.
Figure 10A:
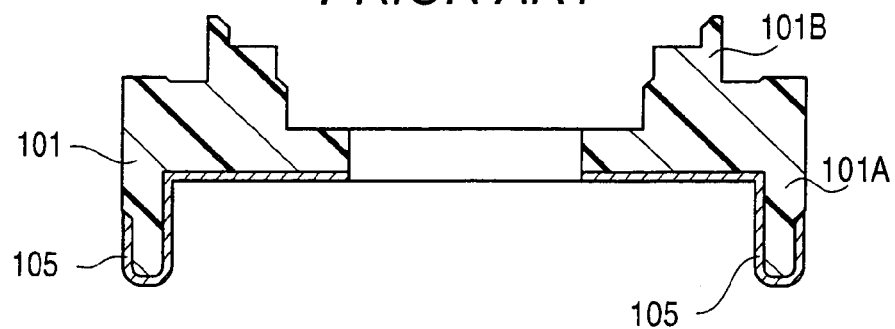
FIGS. 10A to 10C are views showing main portions of steps of mounting the conventional solid-state imaging apparatus.
Figure 10B:
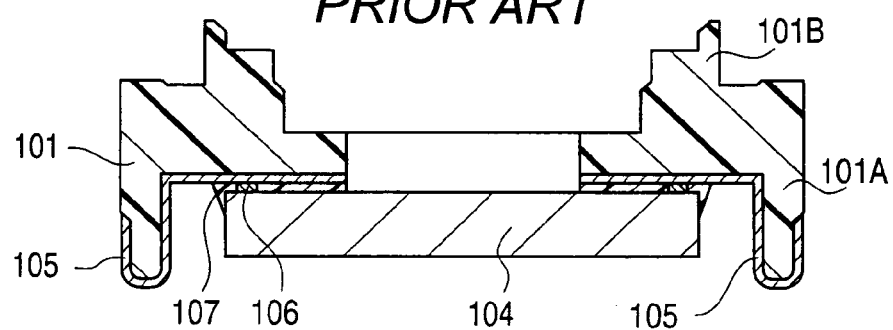
Figure 10C:
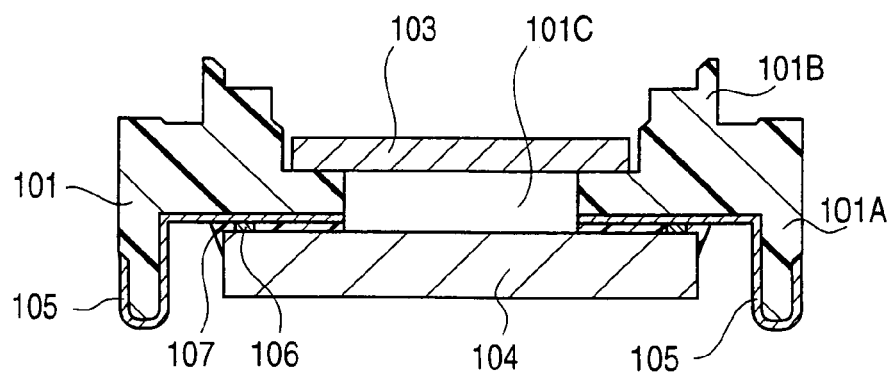

In the production, the apparatus of the embodiment is formed in a similar manner as the first embodiment In the embodiment, however, not only the optical filters but also structure members are integrally molded, and the molded product is finally diced along dicing lines d1, d2, d3, ..., c1, c2, c3, ..., as shown in FIG. 6, thereby obtaining the solid-state imaging apparatus shown in FIG. 5.

Although the optical filter 3 is used as the light-transmitting member in the first and second embodiments, the light-transmitting member is not restricted to the optical filter 3. A light-transmitting sealing member, a lens, or the like may be adequately used as the light-transmitting member.

As the resin constituting the structure member, a thermosetting resin such as an epoxy resin may be used in place of a thermoplastic resin such as a polyphthalamide resin or a PPS resin.

The application of the solid-state imaging apparatus of the invention is not restricted to a camera used in an optical communication field, and the solid-state imaging apparatus can be applied to various optical devices such as a reading device for a CD or a DVD, a reading device for a copier, a medical equipment, and a door phone.

As described above, according to the invention, the light-transmitting member of less thermal deformation is molded integrally with the structure member, and hence it is possible to provide a solid-state imaging apparatus in which thermal deformation of the structure member which occurs during a process of attaching the solid-state image pickup element is greatly reduced and connection failures are largely decreased.

Further, according to the invention, it is possible to provide a method of manufacturing a solid-state imaging apparatus in which a step of attaching the light-transmitting member is not required, and hence the productivity can be improved, and in which also a margin necessary for such attachment is not required, and hence the apparatus can be miniaturized.

What is claimed is:

1. A solid-state imaging apparatus comprising:
   a structure member made of an insulating resin and having a through-opening portion;
   a wiring portion formed on a surface of said structure member;
   a solid-state image pickup element connected to said wiring portion and attached to said structure member to cover the through-opening portion; and
   a light-transmitting member attached to said structure member to cover the through-opening portion and being separated from said solid-state image pickup element by a predetermined distance,
   wherein said light-transmitting member being configured by a plate-like member made of a material which is smaller in coefficient of linear expansion than the insulating resin of said structure member, and integrally molded with said structure member to be embedded at a peripheral portion into said structure member,
   wherein said structure member comprises:
   a solid-state image pickup element mounting portion where said solid-state image pickup element is attached; and
   a penetrated hole communicating with the through-opening portion provided in a region positioned between a solid-state image pickup element mounting portion and a light-transmitting member embedding portion.

2. The solid-state imaging apparatus according to claim 1, wherein said structure member comprises:
   a leg portion on which said wiring portion is to be formed; and
   a cylindrical body portion disposed on said leg portion, wherein the through-opening portion is formed between said body portion and said leg portion.

3. The solid-state imaging apparatus according to claim 1, wherein said light-transmitting member is configured by forming a dielectric thin film of a multilayer structure on a surface of quartz glass.

4. The solid-state imaging apparatus according to claim 1, wherein said light-transmitting member is made of a thermosetting resin.

5. The solid-state imaging apparatus according to claim 1, wherein said light-transmitting member is an optical filter.

6. A method of manufacturing a solid-state imaging apparatus, comprising:
   forming a light-transmitting member by molding a material smaller in coefficient of linear expansion than an insulating resin constituting a structure member into a plate-like member;
   integrally molding the light-transmitting member and the structure member having a through-opening portion and a solid-state image pickup element attaching portion to which a solid-state image pickup element is attached to close the through-opening portion, so that the light-transmitting member is disposed to cover the through-opening portion, to be separated from said solid-state image pickup element attaching portion by a predetermined distance, and the periphery of the light-transmitting member is embedded in the structure member, by conducting a molding process by using said insulating resin as a material after placing said light-transmitting member in molding dies;
   forming a wiring portion on said structure member; and
   attaching said solid-state image pickup element to said solid-state image pickup element attaching portion,
   further comprising forming a penetrated hole in the structure member to face the through-opening portion.

7. The method of manufacturing a solid-state imaging apparatus according to claim 6, wherein the structure member is formed by injection molding and made of a thermoplastic insulating resin.

8. A method of manufacturing a solid-state imaging apparatus, comprising:
   forming a light-transmitting member by molding a material smaller in coefficient of linear expansion than an insulating resin constituting a structure member into a plate-like member;
   integrally molding the light-transmitting member and the structure member having a through-opening portion and a solid-state image pickup element attaching portion to which a solid-state image pickup element is attached to close the through-opening portion, so that the light-transmitting member is disposed to cover the through-opening portion, to be separated from said solid-state image pickup element attaching portion by a predetermined distance, and the periphery of the light-transmitting member is embedded in the structure member, by conducting a molding process by using said insulating resin as a material after placing said light-transmitting member in molding dies;
   forming a wiring portion on said structure member; and
   attaching said solid-state image pickup element to said solid-state image pickup element attaching portion,
   further comprising forming a penetrated hole in the structure member to face the through opening,
   wherein said penetrated hole is formed at each of positions where the penetrated holes face each other across said through-opening portion in a direction perpendicular to an injection direction of the thermoplastic resin.

* * * * *